(12) United States Patent
Schuh et al.

(10) Patent No.: US 7,336,022 B2
(45) Date of Patent: Feb. 26, 2008

(54) PIEZOELECTRICAL BENDING CONVERTER

(75) Inventors: Carsten Schuh, Baldham (DE);
Thorsten Steinkopff, Eglharting (DE);
Andreas Wolff, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 17 days.

(21) Appl. No.: 10/482,201

(22) PCT Filed: Jun. 14, 2002

(86) PCT No.: PCT/DE02/02183

§ 371 (c)(1),
(2), (4) Date: Dec. 29, 2003

(87) PCT Pub. No.: WO03/003478

PCT Pub. Date: Jan. 9, 2003

(65) Prior Publication Data

US 2004/0183406 A1    Sep. 23, 2004

(30) Foreign Application Priority Data

Jun. 27, 2001    (DE) ................................ 101 30 895

(51) Int. Cl.
*H01L 41/08* (2006.01)

(52) U.S. Cl. ...................... 310/332; 310/317; 310/359; 310/369

(58) Field of Classification Search ........ 310/330–332, 310/317, 359, 328, 366, 369
See application file for complete search history.

(56) References Cited

U.S. PATENT DOCUMENTS 3,610,969 A * 10/1971 Clawson et al. ............ 310/314
3,940,974 A *  3/1976 Taylor ........................ 374/177
4,927,084 A *  5/1990 Brandner et al. ........... 239/584

(Continued)

FOREIGN PATENT DOCUMENTS

| DE | 31 42 684 | 5/1983 |
|---|---|---|
| DE | 287 813 | 3/1991 |
| DE | 293 918 | 9/1991 |
| DE | 42 18 368 | 12/1993 |
| EP | 0 784 349 | 7/1997 |
| EP | 0 993 055 | 4/2000 |
| JP | 60-236598 | * 11/1985 |
| WO | WO 94/02965 | * 3/1994 |

OTHER PUBLICATIONS

Patent Abstracts of Japan vol. 1998, No. 03, Feb. 27, 1998 & JP 09 289342 A (Sony Corp), Nov. 4, 1997 Zusammenfassung -& JP 09 289342 A (Sony Corp) Nov. 4, 1997.

(Continued)

*Primary Examiner*—Thomas M. Dougherty
(74) *Attorney, Agent, or Firm*—Young & Thompson

(57) ABSTRACT

Piezoelectrical bending converter with at least one monolithic layered composite, includes a piezoelectric-active ceramic layer with a lateral dimension change which may be generated by application of an electrical field and at least one further piezoelectric-active ceramic layer with a further lateral dimension change, different from the lateral dimension change. An electrode layer is arranged between the ceramic layers, for generation of the electric fields. The layered composite preferably comprises several piezoelectric-active layers and electrode layers arranged between the above. The shift is thus obtained as a gradient of the dimension changes in the direction of the stack of the layered composite. The dimension changes for the ceramic layers and the gradient may be adjusted by the generation of the electrical fields. In order to achieve a shift it is necessary not to have a piezoelectric-inactive layer.

19 Claims, 2 Drawing Sheets

U.S. PATENT DOCUMENTS

| | | | | |
|---|---|---|---|---|
| 5,081,995 A | * | 1/1992 | Lu et al. | 600/459 |
| 5,162,870 A | * | 11/1992 | Toth | 356/469 |
| 5,262,696 A | * | 11/1993 | Culp | 310/328 |
| 5,461,274 A | * | 10/1995 | Yuji et al. | 310/330 |
| 5,471,721 A | * | 12/1995 | Haertling | 29/25.35 |
| 5,589,725 A | * | 12/1996 | Haertling | 310/358 |
| 5,798,600 A | * | 8/1998 | Sager et al. | 310/330 |
| 5,811,911 A | * | 9/1998 | Janker et al. | 310/332 |
| 5,889,354 A | * | 3/1999 | Sager | 310/331 |
| 6,222,304 B1 | * | 4/2001 | Bernstein | 310/328 |
| 6,346,764 B1 | * | 2/2002 | Boyd | 310/366 |
| 6,614,143 B2 | * | 9/2003 | Zhang et al. | 310/317 |
| 7,161,276 B2 | * | 1/2007 | Face | 310/314 |

OTHER PUBLICATIONS

Patent Abstracts of Japan vol. 1998, No. 10, Aug. 31, 1998 & JP 10 144976 A (Denso Corp), May 29, 1998 -& JP 10144976 A (Denso Corp) May 29, 1998.

A. Dogan et al. IEEE Trans. Ultrason., Ferroelectr. Freq. Contr., vol. 44, No. 3, 597-605, 1997.

L. Xiaoping et al., J. Am. Ceram. Soc., 84 (5), 996-1003 (2001).

Yutuka Sugawara et al., Metal-Ceramic Composite Actuators, J.Am. Ceram. Soc., 75 (4), 996-98 (1992).

Gene H. Haertling, "A new type of Ultra-High Displacement Actuator", Am. Ceram. Soc Bulletin, vol. 73, No. 1 Jan. 1994, Feature Technology, pp. 93-96.

Research Corporation Technologies: Werbeschrift vom May 3, 1993, 101 North Wilmot Road, Suite 600, Tucson, Arizona 85711-3335 "Rainbow's offer up to tenfold increase in displacement and load capacity over piezoelectric unimorphs".

* cited by examiner

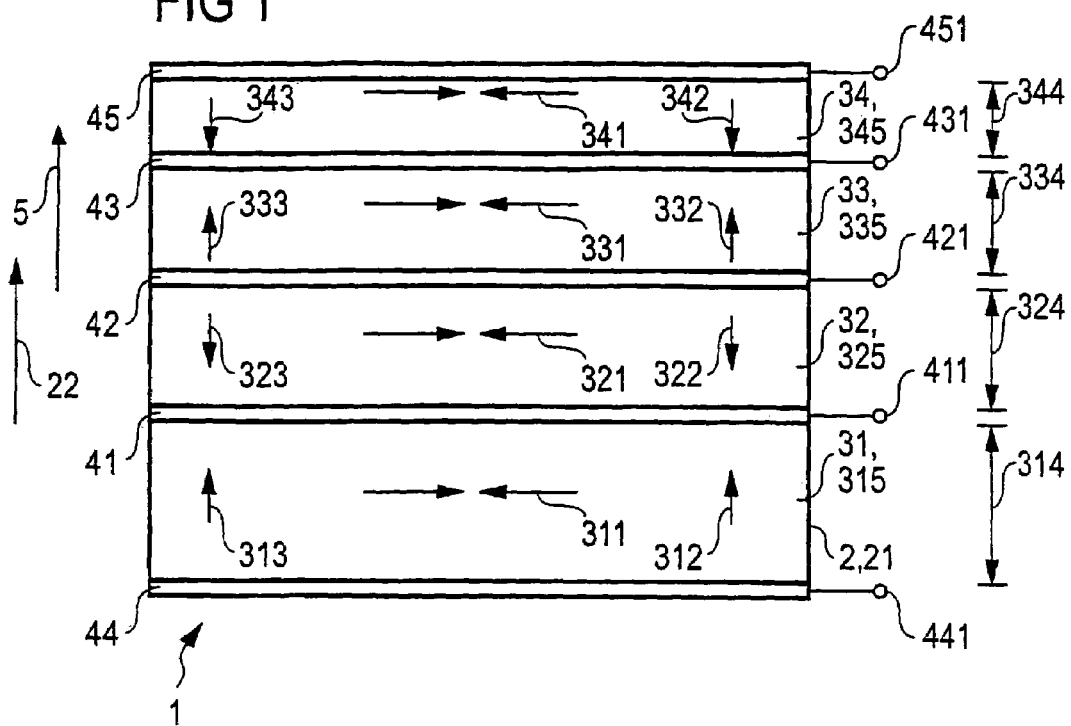
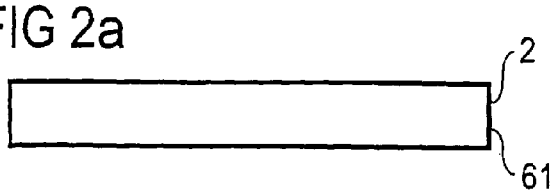
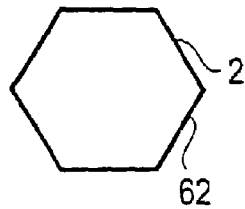
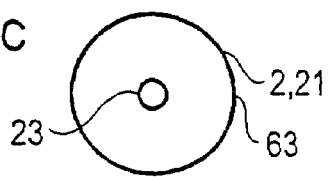

PIEZOELECTRICAL BENDING CONVERTER

CROSS REFERENCE TO RELATED APPLICATIONS

This is the 35 USC 371 national stage of international application PCT/DE02/02183 filed on 14 Jun. 2002, which designated the United States of America.

FIELD OF THE INVENTION

The invention relates to a piezoelectric flextensional transducer with at least one monolithic multilayer system, having a piezoelectrically active ceramic layer with an electric-field-inducible lateral dimensional change and having at least one other piezoelectrically active ceramic layer with another lateral dimensional change inducible by another electric field and different from said lateral dimensional change. A flextensional transducer of this kind is known from Xiaoping L. et al., J. Am. Ceram. Soc., 84 (5), 996-1003 (2001).

BACKGROUND OF THE INVENTION

The piezoelectrically active ceramic layers of the monolithic multilayer system of the known flextensional transducer are made of different lead zirconate titanate (PZT). The ceramic layers exhibit different $d_{31}$ coefficients. Under the effect of an electric field, this produces in each case a dimensional change (contraction) in the relevant ceramic layer along a surface (lateral) stretch of the ceramic layer. The $d_{31}$ coefficient is a measure of the inducible dimensional change and depends, for example, on the ceramic material, the layer thickness and the polarization of the ceramic layer.

In the multilayer system, there is no step change in the $d_{31}$ coefficients between the ceramic layers in the stacking direction of the multilayer system. Instead the $d_{31}$ coefficient varies continuously in the stacking direction, i.e. there is a $d_{31}$ coefficient gradient in the stacking direction.

As a result of the different $d_{31}$ coefficients of the ceramic layers, or $d_{31}$ coefficient gradient, deformation (deflection) of the multilayer system occurs when the ceramic layers are exposed to approximately identical electric fields. A stroke is produced in the stacking direction of the multilayer system.

The actual dimensional change in each ceramic layer and therefore any measure of the deflection or stroke of the multilayer system depends on the strength of the electric field induced in the ceramic layer. To generate the electric fields, the monolithic multilayer system has two electrode layers between which the two piezoelectrically active ceramic layers are disposed. The electric fields in the ceramic layers cannot be generated independently of one another. It is therefore relatively difficult to produce a specific deflection of the multilayer system.

Flextensional transducers of the "Bimorph", "Cymbal", "Moonie", "Multilayer" and "Rainbow" type are known from A. Dogan et al., IEEE Trans. Ultrason., Ferroelectr., Freq. Contr., Vol 44, No. 3, 597-605, 1997. To increase an effective stroke, a plurality of flextensional transducers of one of the types can be arranged to form a stack, each individual flextensional transducer of the stack contributing with its deflection or stroke to the effective stroke of the stack. The flextensional transducers of the types mentioned above have a multilayer system consisting of at least one piezoelectrically active and at least one piezoelectrically inactive layer. To produce the deflection, a marked voltage swing is generated at an interface between the layers. However, the marked voltage swing reduces the reliability of the flextensional transducer. If the flextensional transducer is continuously stressed, this can easily result in failure of the flextensional transducer.

SUMMARY OF THE INVENTION

The object of the present invention is to specify a reliable piezoelectric flextensional transducer whose stroke can be relatively easily adjusted compared to the known prior art.

To achieve this object, a piezoelectric flextensional transducer with at least one monolithic multilayer system is specified, having a piezoelectrically active ceramic layer with an electric-field-induced lateral dimensional change and having at least one other piezoelectrically active ceramic layer with another lateral dimensional change which can be induced by another electric field and which is different from said lateral dimensional change. The piezoelectric flextensional transducer is characterized in that there is disposed between the ceramic layers at least one electrode layer for generating the electric fields.

The monolithic multilayer system consists, for example, of a plurality of piezoelectrically active ceramic layers and internal electrode layers disposed therebetween. Each of the inner electrode layers is used to generate the electric fields in the adjacent piezoelectrically active ceramic layers. Each of the piezoelectrically active ceramic layers is polarized in the thickness direction of the ceramic layer and therefore in the stacking direction of the monolithic multilayer system. During polarization, opposite polarization directions are produced in adjacent ceramic layers by applying alternating polarities to adjacent electrode layers. Electrically driving the electrode layers during operation of the flextensional transducer, i.e. generating electric fields parallel to the polarization directions, produces lateral dimensional changes along the ceramic layers. The ceramic layers are shortened perpendicularly to the polarization directions and therefore to the thickness directions of the ceramic layers.

It is also conceivable for electrode layers electrically isolated from one another to be disposed between adjacent piezoelectrically active ceramic layers, enabling identically oriented polarization directions to be induced in the adjacent ceramic layers.

Monolithic means that the multilayer system is produced by co-firing of the ceramic layers and the electrode layers disposed therebetween. For example, to produce the monolithic multilayer system, a plurality of green ceramic foils printed with electrode material are stacked one on top of another, laminated, if necessary debindered and then co-fired. The green foils are selected e.g. such that co-firing results in ceramic layer thicknesses of between 20 and 500 μm.

The underlying concept of the invention is that only piezoelectrically active ceramic layers are used to produce a deflection or stroke of the flextensional transducers. The stroke is obtained without a piezoelectrically inactive layer. To achieve this, the lateral dimensional changes that can be produced in the ceramic layers are different. In order make the dimensional changes as adjustable as possible, an electrode layer is disposed between every two piezoelectrically active ceramic layers. The electrode layer is very thin compared to the ceramic layers and does not therefore act as piezoelectrically inactive layers in the abovementioned sense. Using the electrode layer, a defined polarization of the adjacent ceramic layers is produced in each case. The electrode layer is additionally used to generate the electric fields required for the dimensional changes. Both the polarizations and the electric fields or the strengths of the electric fields can be more easily and precisely adjusted compared to the known prior art. This is because, for example, any likelihood of a mixed phase or void between adjacent ceramic layers being produced during co-firing is greatly reduced by the electrode layer. Mixed phases or voids of this kind have an unpredictable effect on the polarization of a ceramic layer and likewise the electric field to which the ceramic layer is exposed during operation.

In a particular embodiment, a gradient in the lateral dimensional changes of the ceramic layers can be produced in one stacking direction of the multilayer system. This means that during operation of the flextensional transducer, the magnitude of the dimensional changes varies from one ceramic layer to the next in one direction in the stacking direction of the multilayer system. For example, the multilayer system can consist of three piezoelectrically active ceramic layers. During operation, the size of the contraction of the three ceramic layers reduces from ceramic layer to ceramic layer. Although the dimensional changes vary abruptly from ceramic layer to ceramic layer, the dimensional changes are preferably adjusted such that any voltage swings occurring between adjacent ceramic layers are much smaller than in a system comprising a piezoelectrically active and a piezoelectrically inactive layer.

There are various ways of achieving different lateral dimensional changes. For example, the ceramic layers could have different $d_{31}$ coefficients and the electric fields acting on the ceramic layers to achieve the deflection of the multilayer system during operation could be identical. It is also conceivable for the $d_{31}$ coefficients to be the same, but the electric fields to be different.

The $d_{31}$ coefficient depends on the ceramic material of the ceramic layers. In a particular embodiment, the ceramic layers are of the same ceramic material. This has the advantage, for example, that (if the polarization of ceramic layers is sufficiently identical) virtually no bending as the result of a different coefficient of thermal expansion of different ceramic material occurs. There is no thermally induced deflection. However, it is also conceivable for the ceramic layers to be made of different ceramic material, this being advantageous if the coefficients of thermal expansion of the ceramic materials are similar.

In a further embodiment, the ceramic layers have essentially identical layer thicknesses. "Essentially identical" means that a tolerance of up to 10% is permissible. If the layer thicknesses of the ceramic layers are the same and the ceramic layers consist of identical ceramic material, a different dimensional change can be produced by different electric field strengths acting on the ceramic layers, the polarization being the same. Different dimensional changes are also accessible due to the fact that the ceramic layers have different polarizations and are exposed to identical or similar electric field strengths, said field strengths being advantageously selected such that there is no change in the polarization of the ceramic layers (re-poling) during operation of the flextensional transducer.

In a particular embodiment, the ceramic layers have different layer thicknesses. Both for polarization of the ceramic layers and during operation of the flextensional transducer, the electrode layers can have the same electric potentials applied to them with alternating wiring. As a result, with identical electrical driving of the electrode layers, different dimensional changes can be produced in the ceramic layers.

In a further embodiment, the multilayer system has at least one means of reducing any intrinsic stiffness of the multilayer system. By reducing the intrinsic stiffness, the stroke of the multilayer system can be increased. The means of reducing the intrinsic stiffness is in particular a hole. The hole is disposed in the multilayer system in such a way that, in the case of said multilayer system with a hole, less energy is required for a specific stroke than for a corresponding multilayer system without a hole. The hole is e.g. a bore in or through the multilayer system in the stacking direction.

The multilayer system can have any footprint. The footprint can be rectangular, for example, resulting in a strip-shaped multilayer system. A footprint in the shape of a regular hexagon is also conceivable. In a particular embodiment, the multilayer system has a circular footprint. The multilayer system constitutes a disk bender, each of the ceramic layers preferably being a disk. During polarization of a disk-shaped ceramic layer in the thickness direction, the $d_{31}$ coefficient acts radially and in the circumferential direction of the ceramic layer. The circumference of the ceramic layer is reduced parallel to the polarization direction due to the effect of an electric field. The $d_{31}$ coefficient is advantageously superposed by the $d_{33}$ coefficient, resulting in an increase in the layer thickness. A displacement in the axial direction occurs, thereby increasing the resulting stroke of the ceramic layer.

Another feature of the disk bender is its good stability. The disk bender is self-supporting. A disk bender support is, for example, not a point but extends across the circumference of the disk bender. A further advantage is that the disk bender only has to be fastened. Unlike a flextensional transducer in strip format, for example, it does not need to be clamped. If the flextensional transducer is very rigidly clamped, this may result, for example, in mechanical damage to the flextensional transducer in the clamping region. No such problem arises with the disk bender. Further advantages compared to other types include increased blocking force, increased rigidity and a relatively high resonant frequency. In addition, tried and tested methods for manufacturing ceramic multilayer actuators can be used for manufacturing the disk bender.

In a particular embodiment, a plurality of monolithic multilayer systems are arranged in a stack. Specifically a plurality of multilayer systems in the form of disk benders are arranged in a stack. The disk benders are reciprocally disposed so that a considerable effective stroke can be achieved as the result of an additive superposition of the strokes of the individual disk benders, said disk benders being externally fastenable via a casing. If the disk benders have a hole, they can also be fastened via a spindle passing through the holes.

To summarize, the invention provides the following main advantages:

No piezoelectrically inactive layer is required to achieve the stroke.

In the multilayer system, a dimensional change gradient can be produced, causing the stroke.

The sudden voltage changes occurring between the ceramic layers are very small, thereby increasing the stability of the flextensional transducer.

The electric fields to which the ceramic layers are exposed during operation can be freely selected by the (separately drivable) electrode layers between the piezoelectrically active ceramic layers of the multilayer system.

The electrode layers prevent the formation of mixed phases and voids at the interfaces of adjacent ceramic layers. The electric fields and therefore the dimensional changes can be easily adjusted.

In the multilayer structure, relatively low voltages can be applied to the electrode layers to achieve the stroke.

A flextensional transducer with a multilayer system in the form of a disk bender is inexpensive to manufacture, self-supporting and stable. Because of the interaction of the $d_{31}$ and $d_{33}$ coefficients, it is characterized by a particularly large stroke.

A high effective stroke can be achieved by stacking a plurality of multilayer systems, in particular disk benders, one on top of the other.

BRIEF DESCRIPTION OF THE DRAWINGS

The piezoelectric flextensional transducer with monolithic multilayer system will now be presented with reference to a number of exemplary embodiments and the associated figures. The figures are schematic and are not drawn to scale.

FIG. 1 shows a multilayer system in a lateral cross-section.

FIGS. 2a to 2c show the footprints of various multilayer systems.

DETAILED DESCRIPTION OF THE INVENTION

Figure 3A:
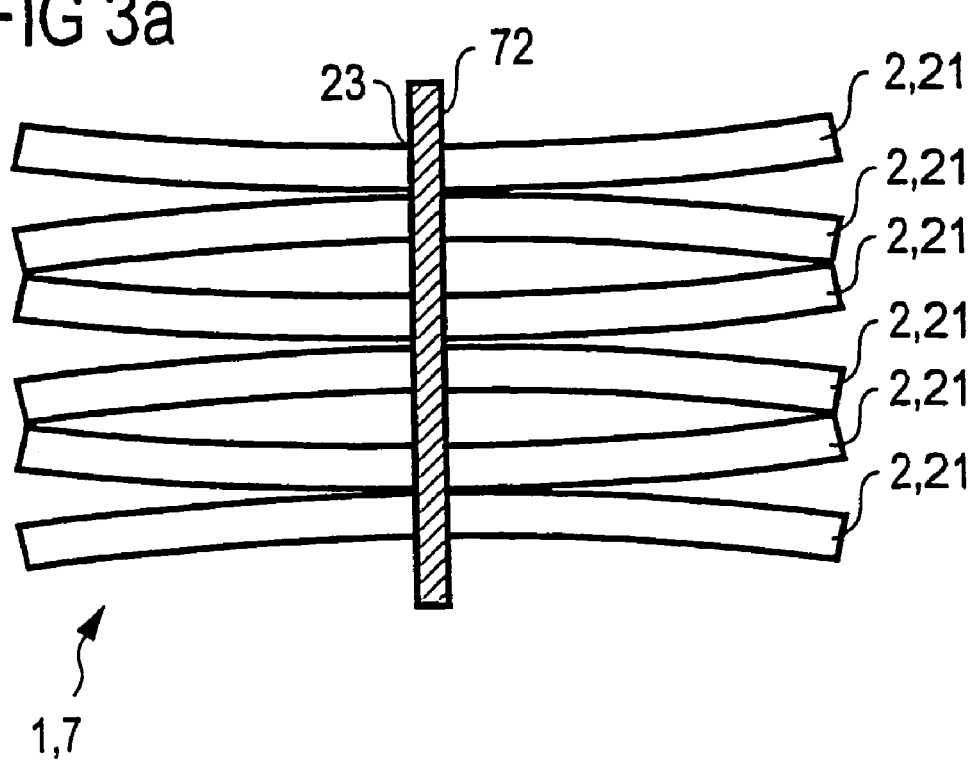
FIGS. 3a and 3b show stacks of electrically driven multilayer systems.

The piezoelectric flextensional transducer 1 has a monolithic multilayer system 2 (FIG. 1). The multilayer system 2 consists of four piezoelectrically active ceramic layers 31 to 34. The ceramic layers are of the same ceramic material 315 to 345 in each case. The ceramic material is a lead zirconate titanate (PZT). The polarizations 313 to 343 of the ceramic layers 31 to 34 are approximately identical in terms of absolute value. The polarizations of adjacent ceramic layers are parallel to one another, but oppositely oriented. The $d_{31}$ coefficients of the ceramic layers are identical and are approximately −350 pm/V. The layer thicknesses of the ceramic layers 31 to 34 are different, measuring between 50 and 150 μm and reducing in the stacking direction 22 of the multilayer system 2. Inner electrode layers 41 to 43 are disposed between the ceramic layers 31 to 34. The termination in the stacking direction 22 of the monolithic multilayer system is formed by two outer electrode layers 44 and 45. The overall thickness of the multilayer system 2 is 300 μm. The multilayer system 2 is a disk bender 21 with a circular footprint 63 having a radius of approximately 5 mm (FIG. 2c). To reduce the intrinsic stiffness, the disk bender 2 has a hole 23 with a radius of approximately 1.5 mm (FIG. 2c). The hole 2 is a bore through the disk bender 2 in the stacking direction 22.

During operation of the flextensional transducer 1, potentials 411 to 451 are alternately applied to the inner and outer electrode layers 41 to 45. The potentials 411 and 431 are 100 V and the potentials 441, 421 and 451 are 0 V. By means of the combination of different layer thicknesses of the piezoelectrically active ceramic layers and identical potential differences between the electrode layers, the ceramic layers are subjected to electric fields 312 to 342 of different strengths. This results in different dimensional changes 311 to 314, a gradient 5 in the lateral dimensional changes being produced in the multilayer system 2 or in the disk bender.

A feature of another embodiment is that the layer thicknesses of the ceramic layers 31 to 34 are essentially identical. To achieve different lateral dimensional changes in the ceramic layers, different potential differences and thereby electric fields of different strengths can be produced between the electrode layers. The electrode layers are individually driven.

Further embodiments differ from those described in having different multilayer system footprints. A rectangular footprint 61 (FIG. 2a) results in a strip-shaped multilayer system. A hexagonal footprint 62 is also conceivable, as indicated in FIG. 2b.

Figure 3B:
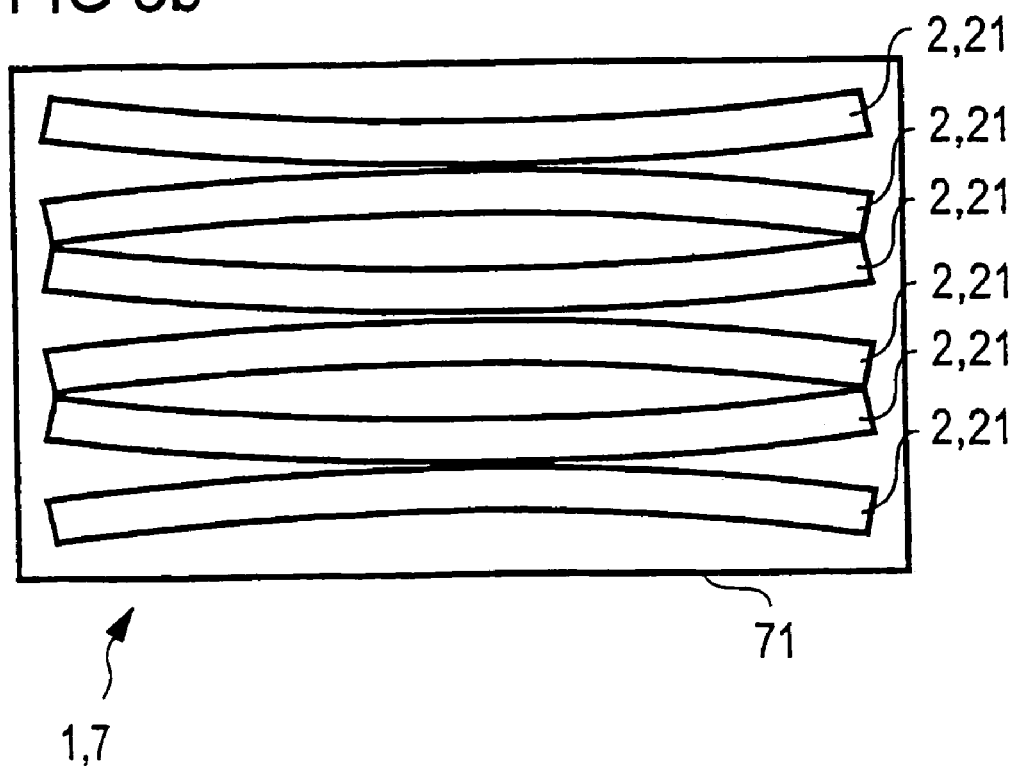

In order to maximize the stroke, a plurality of multilayer systems 2 in the form of disk benders 21 are arranged in a stack 7. The disk benders 21 are reciprocally stacked. This means that electrically driving the disk benders 21 results in an additive superposition of the strokes produced in the individual disk benders to produce an overall effective stroke. In one embodiment, a spindle 72 passing through the bores 23 through the stacked disk benders 21 is used for fastening (FIG. 3a). Alternatively, the stack 7 is disposed in an appropriately dimensioned casing 71 (FIG. 3b).

The invention claimed is:

1. Piezoelectric flextensional transducer, comprising:
   at least one monolithic multilayer system, comprising
   a first piezoelectrically active ceramic layer with a first lateral dimensional change inducible by a first electric field;
   a second piezoelectrically active ceramic layer with a second lateral dimensional change inducible by a second electric field and different in magnitude from said first lateral dimensional change;
   at least a third piezoelectrically active ceramic layer with another lateral dimensional change inducible by a third electric field and different in magnitude from said second lateral dimensional change;
   at least a first electrode layer disposed between the first and second ceramic layers for generating the first and second electric fields; and
   at least a second electrode layer disposed between the second and third ceramic layers for generating the second and third electric fields,
   wherein the first electrode layer is laminated on the first ceramic layer and the second ceramic layer is laminated on the first electrode layer,
   wherein the second electrode layer is laminated on the second ceramic layer and the third ceramic layer is laminated on the second electrode layer,
   wherein the multilayer system has a circular footprint,
   wherein a thickness direction of the ceramic layers defines a stacking direction of the monolithic system,
   wherein a gradient in the first, second, and third lateral dimensional changes of the ceramic layers, can be produced in the stacking direction of the multilayer system, and
   wherein the multilayer system is self-supporting across a circumference of the circular footprint.

2. Flextensional transducer according to claim 1, wherein each of the ceramic layers are of the same ceramic material and have an upper surface printed with electrode material, the electrode material of each ceramic layer constituting one electrode layer.

3. Flextensional transducer according to claim 1, wherein the ceramic layers are of different ceramic material.

4. Flextensional transducer according to claim 1, wherein the ceramic layers have essentially identical layer thicknesses and different lateral dimensional changes are achieved in each of the ceramic layers by the first and second electric fields being of different strengths, and the multilayer system is free on any piezoelectrically inactive layers between the piezoelectrically active first and second layers.

5. Flextensional transducer according to claim 1, wherein the ceramic layers have different layer thicknesses, and the multilayer system is free on any piezoelectrically inactive layers between the piezoelectrically active first and second layers.

6. Flextensional transducer according to claim 1, wherein the multilayer system has at least one means for reducing any intrinsic stiffness of the multilayer system.

7. Flextensional transducer according to claim 6, wherein the means for reducing the intrinsic stiffness is a hole.

8. Flextensional transducer according to claim 1, comprising a plurality of monolithic multilayer systems arranged in a stack.

9. Flextensional transducer according to claim 1, wherein the ceramic layers are of the same ceramic material, and the multilayer system is free on any piezoelectrically inactive layers between the piezoelectrically active first and second layers.

10. Flextensional transducer according to claim 1, wherein the ceramic layers are of different ceramic material.

11. Flextensional transducer according to claim 1, wherein the ceramic layers have essentially identical layer thicknesses, and the multilayer system is free on any piezoelectrically inactive layers between the piezoelectrically active first and second layers.

12. Flextensional transducer according to claim 1, wherein the ceramic layers have different layer thicknesses.

13. Flextensional transducer according to claim 1, wherein the multilayer system has at least one means for reducing any intrinsic stiffness of the multilayer system.

14. Flextensional transducer according to claim 1, wherein the means for reducing the intrinsic stiffness is a hole.

15. Flextensional transducer according to claim 1, comprising a plurality of monolithic multilayer systems arranged in a stack.

16. Piezoelectric flextensional transducer with at least one monolithic multilayer system, comprising:
at least three adjacent piezoelectrically active ceramic layers defining the monolithic multilayer system; and
at least one electrode layer located between each pair of the adjacent ceramic layers, each electrode layer for generating electric fields for the pair of adjacent ceramic layers, wherein,
a thickness direction of the ceramic layers defines a stacking direction of the monolithic system,
the electrode layers provide an electric field that induces a lateral dimensional change in each of the ceramic layers, each electric-field-induced lateral dimensional change being different in magnitude from the electric-field-induced lateral dimensional changes of each adjacent active ceramic layer and a gradient in the lateral dimensional changes of the three adjacent ceramic layers is produced in the stacking direction,
each ceramic layer is polarized in a thickness direction of the ceramic layer and therefore in the stacking direction of the monolithic multilayer system,
during polarization of the ceramic layers, opposite polarization directions are produced in adjacent ceramic layers by applying alternating polarities to adjacent electrode layers,
electrically driving the electrode layers generates the electric fields parallel to the polarization directions and produces the lateral dimensional changes along the ceramic layers with the ceramic layers shortened perpendicularly to the polarization directions and therefore to the thickness directions of the ceramic layers,
during operation, a size of a contraction of each of the adjacent three ceramic layers reduces respectively from a first ceramic layer to each successive one of the adjacent ceramic layers,
the multilayer system has one of a circular, a hexagonal and a rectangular footprint with each of the ceramic layers being of a corresponding one of the circular, the hexagonal and the rectangular shape, and the multilayer system is free on any piezoelectrically inactive layers between the piezoelectrically active layers, and
the assembly is self-supporting across the footprint.

17. Flextensional transducer according to claim 16, wherein the assembly has the hexagonal footprint with each of the ceramic layers being of the hexagonal shape and the assembly is self-supporting across a circumference of the footprint.

18. Flextensional transducer according to claim 16, wherein the assembly has the circular footprint with each of the ceramic layers being of the circular shape and the assembly is self-supporting across a circumference of the footprint.

19. Piezoelectric flextensional transducer, comprising:
three piezoelectrically active ceramic layers of the same ceramic material, the three ceramic layers laminated one to another,
polarizations of the three ceramic layers being approximately identical in terms of absolute value,
the polarizations of three ceramic layers being parallel to one another and oppositely oriented;
inner electrode layers laminated between adjacent ones of the three ceramic layers; and
outer electrode layers laminated on outside surfaces of the outer ones of the three ceramic layers, wherein,
each of the three ceramic layers has a different lateral dimensional change inducible by a respective electric field generated by the electrode layers, and
wherein a gradient in the lateral dimensional changes of the ceramic layers is produced in a stacking direction.

* * * * *